(12) United States Patent
Kortekaas et al.

(10) Patent No.: US 12,213,285 B2
(45) Date of Patent: Jan. 28, 2025

(54) CONDUCTION COOLED CHASSIS

(71) Applicant: AMETEK, INC., Berwyn, PA (US)

(72) Inventors: Peter Kortekaas, Austin, TX (US); Jonathan Anderson, Huntsville, AL (US); Joo-Han Kim, Huntsville, AL (US); Brian Hoden, Albuquerque, NM (US)

(73) Assignee: AMETEK, INC., Berwyn, PA (US)

( * ) Notice: Subject to any disclaimer, the term of this patent is extended or adjusted under 35 U.S.C. 154(b) by 249 days.

(21) Appl. No.: 17/871,136

(22) Filed: Jul. 22, 2022

(65) Prior Publication Data

US 2023/0025346 A1 Jan. 26, 2023

Related U.S. Application Data

(60) Provisional application No. 63/225,133, filed on Jul. 23, 2021.

(51) Int. Cl.
*H05K 7/20* (2006.01)
*H05K 7/14* (2006.01)

(52) U.S. Cl.
CPC ......... *H05K 7/2039* (2013.01); *H05K 7/1407* (2013.01); *H05K 7/20336* (2013.01); *H05K 7/1418* (2013.01)

(58) Field of Classification Search
CPC ............ H05K 7/1407; H05K 7/20545; H05K 7/2039; H05K 7/20336; H05K 7/1418; H05K 7/1404; H05K 7/1405; H05K 7/1408; H05K 7/1409; H05K 7/1402
See application file for complete search history.

(56) References Cited

U.S. PATENT DOCUMENTS

| | | | | |
|---|---|---|---|---|
| 5,262,587 | A * | 11/1993 | Moser | H05K 7/1404 174/15.1 |
| 10,034,403 | B1 * | 7/2018 | Flannery | F16B 2/14 |
| 2010/0319948 | A1 * | 12/2010 | Vander Ploeg | H05K 9/0084 174/2 |
| 2010/0321891 | A1 * | 12/2010 | Steenwyk | H05K 7/20545 361/707 |
| 2010/0321892 | A1 * | 12/2010 | Vander Ploeg | H05K 9/0062 361/707 |
| 2011/0176867 | A1 * | 7/2011 | Mosier | F16B 2/14 403/409.1 |
| 2014/0251577 | A1 * | 9/2014 | Connors | H01L 23/427 165/67 |
| 2015/0168087 | A1 * | 6/2015 | Kim | H05K 7/20454 361/720 |
| 2017/0339805 | A1 * | 11/2017 | Lassini | H05K 7/20545 |

* cited by examiner

*Primary Examiner* — Adam B Dravininkas
(74) *Attorney, Agent, or Firm* — Buchanan Ingersoll & Rooney PC

(57) ABSTRACT

An electronic assembly having a multi-slot card assembly and a chassis is provided. The chassis has two or more chassis mounting slots, each including three walls. The multi-slot card assembly is mountable into the chassis and has two or more protrusions. The card assembly comprises at least one heat frame, at least one circuit card module mounted to the at least one heat frame, and at least one expandable fastener. When the card assembly is mounted into the chassis and the at least one fastener is expanded, the at least one fastener applies force against both of one of the walls of the slot and a surface of the at least one heat frame.

31 Claims, 13 Drawing Sheets

CONDUCTION COOLED CHASSIS

CROSS REFERENCE TO RELATED APPLICATIONS

This application claims priority from U.S. Provisional Application Ser. No. 63/225,133, titled "WEDGELOCK AND FLOATING RAIL FOR CONDUCTION COOLED CHASSIS," filed Jul. 23, 2021, incorporated herein by reference in its entirety.

TECHNICAL FIELD

The present invention relates generally to electronic assemblies, and more particularly, to conduction cooled electronic assemblies.

BACKGROUND

Proper operation of electronic devices or assemblies requires proper management and maintenance of their associated electronic components (e.g., circuit boards, circuit modules, processors, memory, disk drives, etc.). The associated electronic components may be stacked or aligned within an electronic unit, chassis, housing, frame, or rack. Further, the associated electronic components may comprise heat-generating electronic components. As the electronic device or assembly becomes heated, the electronic device or assembly may suffer from overheating, operational failure, degradation, other forms of thermal or mechanical stresses, or combinations thereof.

While electronic devices or assemblies commonly include standard or conventional conduction cooling methods for heat dissipation, use of such methods can also create undesirable mechanical stresses and strains for the associated electronic components. In addition, engaging one or more sets of fasteners, such as wedgelocks, to secure multiple card assemblies containing associated electronic components that generate heat can create stresses and strains on the card assemblies and other parts. Such mechanical stresses and strain may be especially problematic or unmanageable for systems requiring (i) multiple electronic components, (ii) maximum processing or computing power, and/or (iii) specialized or harsh operating environments (e.g. aerospace, defense, extreme temperatures, high vibration, etc.). Further, these mechanical stresses and strains can cause in-field maintenance or replacement of associated electronic components. This can lead to irregular and relatively inefficient mounting or installation of such associated electronic components, as well as inability to maintain such associated electronic components in safe and reliable functioning condition.

Thus, there remains a need to provide alternative or improved electronic assemblies, and particularly electronic assemblies having multiple electronic components that can be mounted within a standard conduction cooled chassis, while mitigating mechanical stresses and strains associated with (i) engaging multiple fasteners and (ii) standard conduction cooling methods.

SUMMARY

Aspects of the present invention are directed to electronic assemblies for mounting into a chassis, including a standard conduction cooled chassis.

In one exemplary aspect, there is provided a multi-slot card assembly having two or more protrusions and configured to mount into a chassis having two or more chassis mounting slots, the chassis mounting slots each having at least three surfaces or walls. The multi-slot card assembly comprises at least one heat frame, at least two circuit card modules mounted adjacent the at least one heat frame, and at least one fastener coupled to the at least one guide rail and expandable to apply force to one or more of the at least one heat frame and the respective chassis mounting slot when the multi-slot card assembly is mounted into the chassis.

In another exemplary aspect, there is provided an electronic assembly. The electronic assembly comprises a chassis having two or more chassis mounting slots, the chassis mounting slots each having at least three walls and a multi-slot card assembly having two or more protrusions and mountable into the chassis. The multi-slot card assembly comprises at least one heat frame, at least two circuit card modules mounted adjacent the at least one heat frame, and at least one fastener expandable to apply force to one or more of the at least one heat frame and the respective chassis mounting slot when the multi-slot card assembly is mounted into the chassis.

In another exemplary aspect, there is provided a multi-slot card assembly having at least two protrusions and configured to mount into a chassis having two pairs of chassis mounting slots, the chassis mounting slots each having at least three walls. The multi-slot card assembly comprises a primary heat frame including a primary heat frame surface; a secondary heat frame including a secondary heat frame side wall; at least two circuit card modules mounted adjacent at least one of the primary heat frame and the secondary heat frame; and a pair of bi-directional fasteners expandable to apply force to at least one of the walls of the chassis mounting slots.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be omitted. In addition, according to common practice, the various features of the drawings are not drawn to scale unless otherwise indicated, and the dimensions of the various features may be expanded or reduced for clarity. Included in the drawings are the following figures.

DETAILED DESCRIPTION

The electronic assemblies disclosed herein are usable for mounting electronic components within a chassis, such as a conventional or standard conduction cooled chassis. While the disclosed electronic assemblies are described herein with respect to mounting within a conventional or standard conduction cooled chassis, it will be understood that the invention is not so limited. To the contrary, aspects of the present invention are usable in any application in which stacking or aligning electronic assemblies within an electronic unit or frame is desired.

As used herein, the term "electronic assembly" comprises any multi-slot card assembly with multiple heat frames that need to interface directly with the chassis slots. As an exemplary embodiment, an electronic assembly may comprise a system having multiple interconnected circuit boards having high power field-programmable gate array (FPGA) sets, processors or high power electrical components. As another exemplary embodiment, an electronic assembly may comprise a system having conduction cooled products with multiple interconnected circuit boards having high power field-programmable gate array (FPGA) sets or high power electrical components. In another exemplary embodiment, an electronic assembly comprises a system using multiple circuit cards that have shared heat frames. This embodiment may include adding a heat frame with a circuit card mounted on the opposite side.

Still further, the electronic assembly comprises a system requiring thermal management of associated electronic components or any other electronics unit that requires cooling, such as via standard conduction cooling methods. Likewise, the term "heat frame" may include any electronic housing, unit, housing, frame, rack, compartment adapted to house, contain, or enclose (partially or entirely) associated electronic components, including associated electronic components that generate heat (of varying degrees) or require heat dissipation or cooling.

Figure 1A:
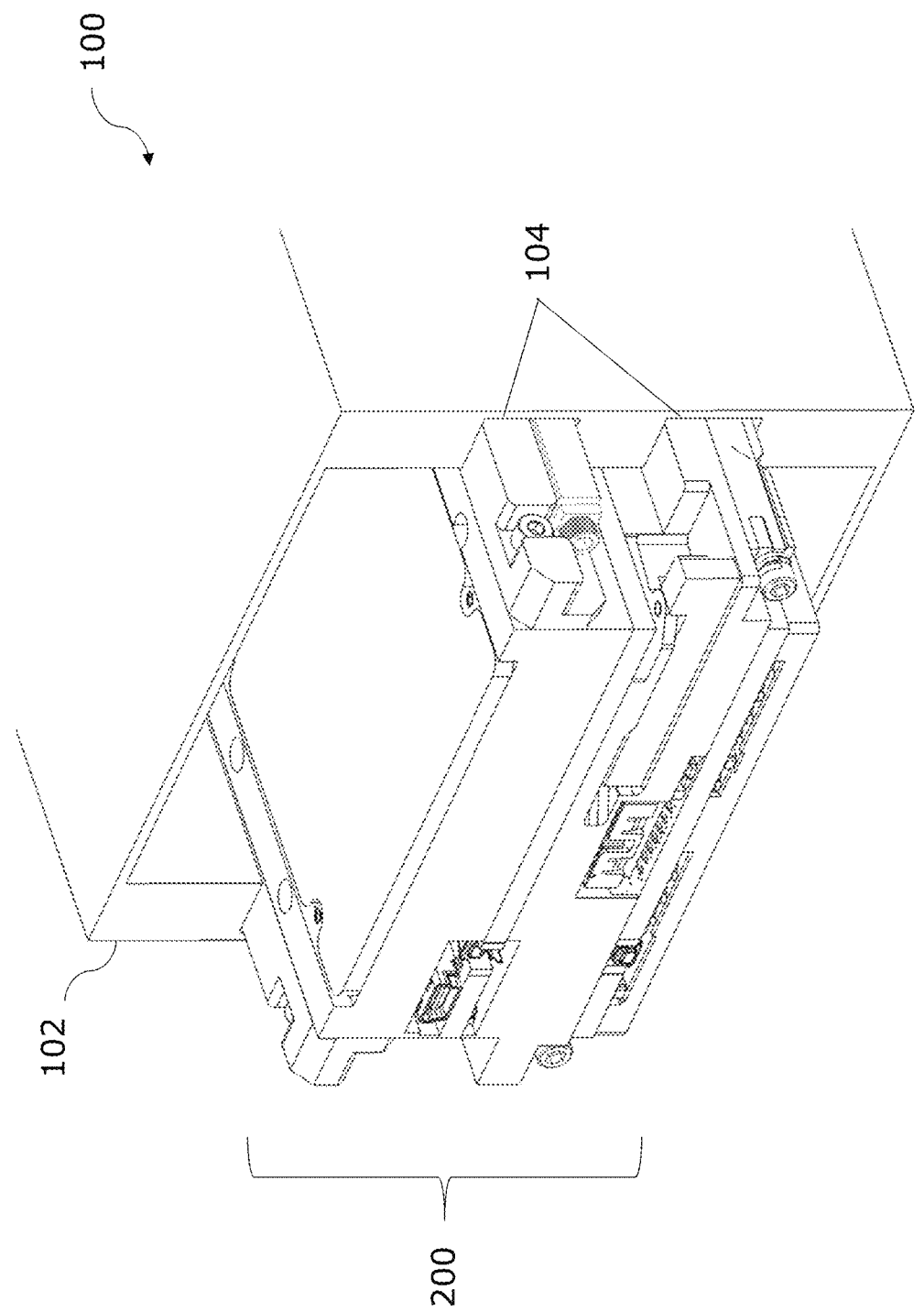
FIG. 1A is an isometric view, as viewed from the top, right, and front sides, of an exemplary electronic assembly comprising an exemplary multi-slot card assembly configured for mounting within an exemplary chassis.
Figure 1B:
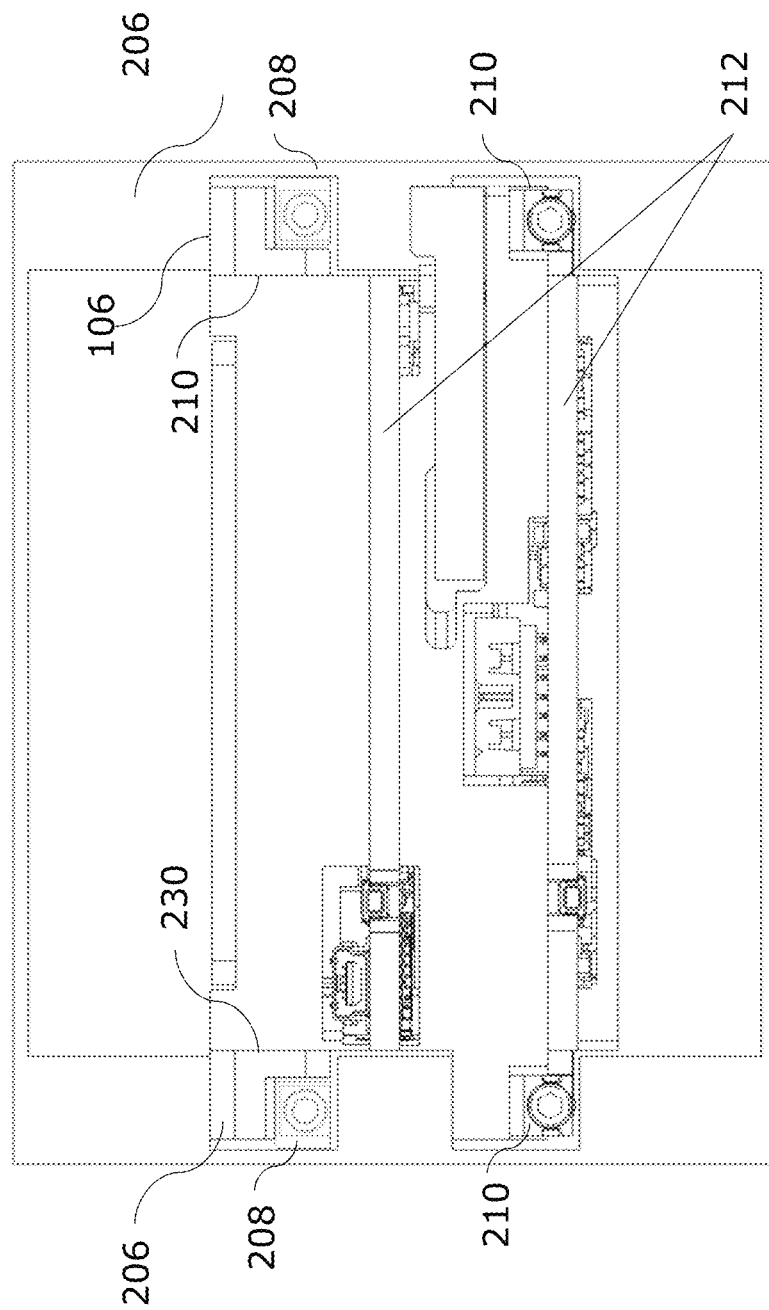
FIG. 1B is a front view of the electronic assembly of FIG. 1A.
Figure 1D:
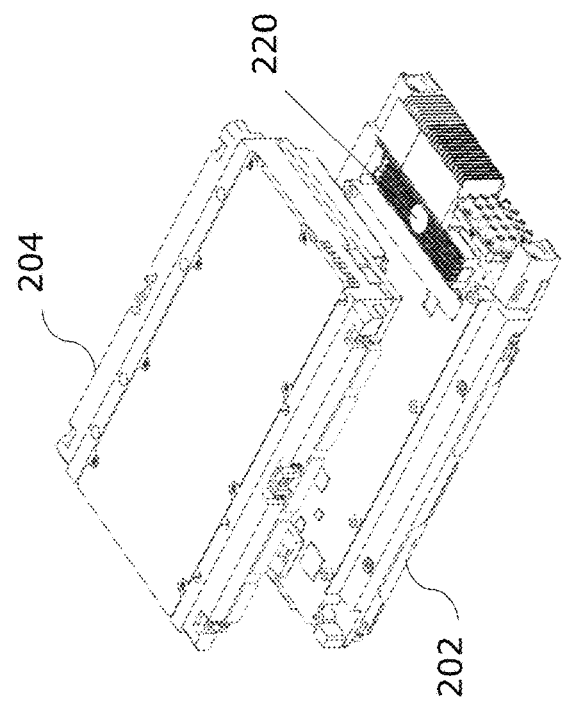
FIG. 1D is a partially exploded view of the multi-slot-card assembly.
Figure 1C:
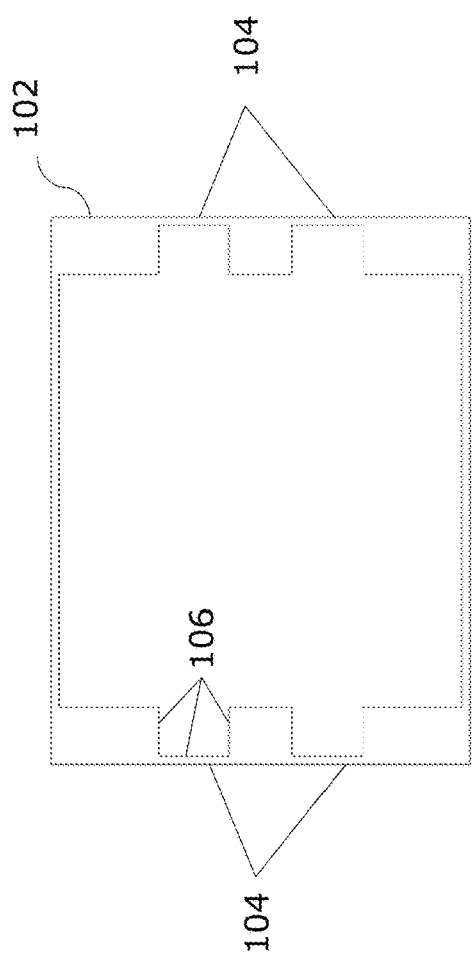
FIG. 1C is a front view of the chassis.

With reference to the drawings, FIGS. 1A-1D illustrates an exemplary electronic assembly 100 comprising one or more multi-slot card assemblies 200 mountable into an exemplary chassis 102. Although FIGS. 1A-1C, 5, and 7 show electronic assembly 100 as including a multi-slot card assembly 200 mounted into chassis 102, a person of ordinary skill in the art would understand that multiple multi-slot card assemblies 200 may be mounted in any configuration within chassis 102. Chassis 102 has sufficient rigidity and strength to securely fix one or more of multi-slot card assemblies 200. Chassis 102 having two or more mounting slots 104 may comprise a single unitary part, or it may be an assembly of structural elements comprising multiple individual unitary parts. As best shown in FIG. 1C, chassis mounting grooves or slots 104 each include at least three internal walls or surfaces 106, which together define a mounting surface configured for receiving, seating, or securing a portion of one or more multi-slot card assemblies 200. Additionally, it should be understood that although FIG. 1C references internal walls 106 for one of a plurality of slots 104, internal walls 106 are similarly present for each of the plurality of slots 104 of chassis 102. As shown in FIGS. 1A and 1C, each slot 104 has a size and shape that corresponds to and is configured to receive a portion of one or more multi-slot card assemblies 200. In an exemplary embodiment, as shown in FIG. 1C, slot 104 includes three internal walls 106.

Figure 2:
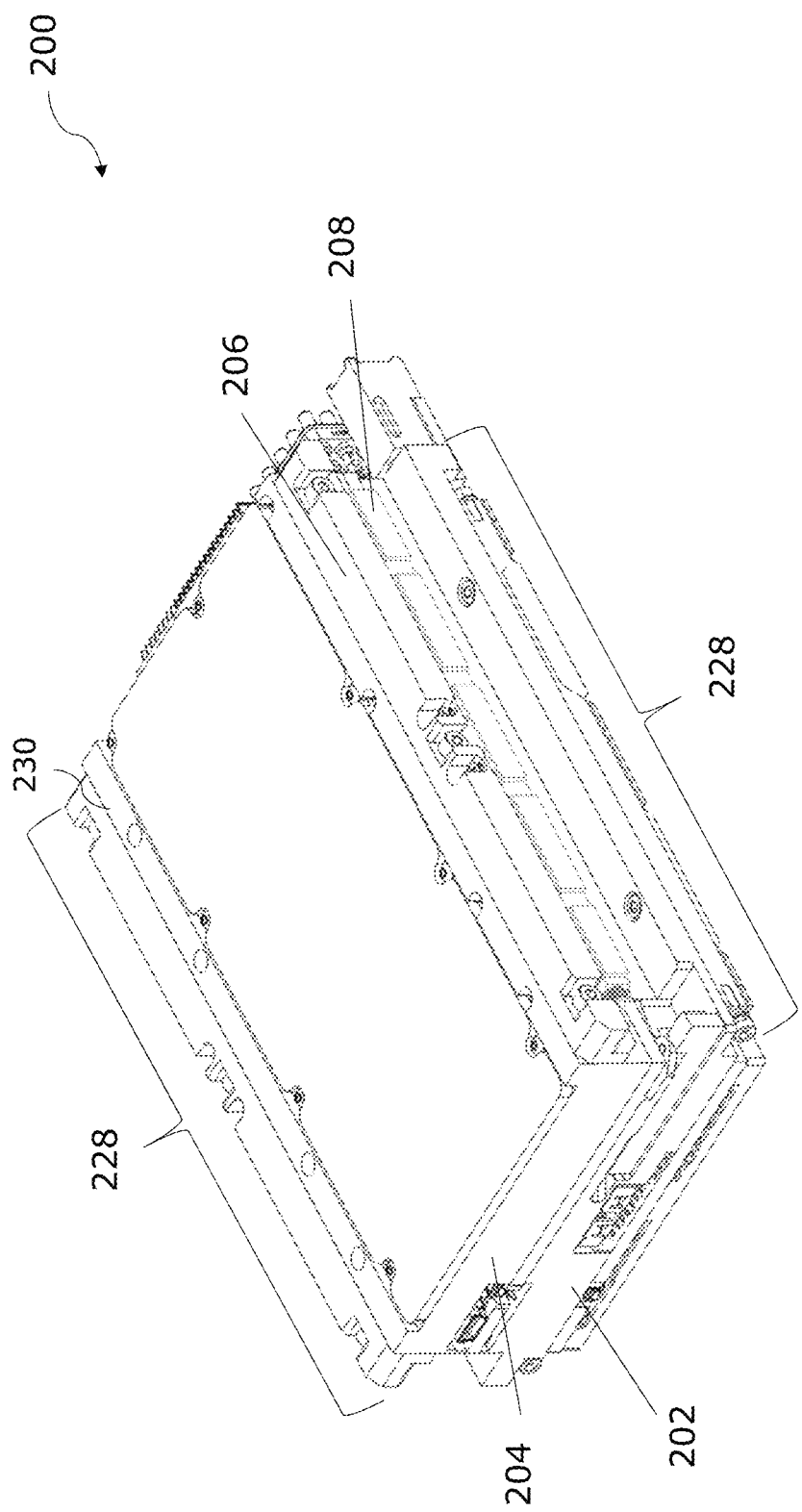
FIG. 2 is an isometric view of the multi-slot card assembly.

Referring now to FIGS. 1B and 2, one or more multi-slot card assemblies 200 may comprise a single unitary part, or it may be an assembly of structural elements comprising multiple individual unitary parts. For example, as shown in FIG. 2, one or more multi-slot card assemblies 200 may be an assembly of parts including at least one heat frame, such as a primary heat frame 202 and a secondary heat frame 204, a guide rail 206, and a diagonal fastener 208. At least one heat frame 202/204 each includes a pair of corresponding surfaces or side walls 230.

In an exemplary embodiment, adjacent to each surface or side wall 230 is at least a corresponding protrusion or floating rail assembly 228 (FIG. 2) of multi-slot card assembly 200 comprising guide rail 206 and diagonal fastener 208. As shown in FIG. 1B, protrusion or floating rail assembly 228 is configured to be received by one or more slots 104 of chassis 102. Further, it should be understood that although FIG. 2 references one protrusion or floating rail assembly 228 of multi-slot card assembly 200, protrusion or floating rail assembly 228 may be similarly present and adjacent to each of side walls 230 of each heat frame 202/204. In another exemplary embodiment, protrusion or floating rail assembly 228 (FIG. 2) of multi-slot card assembly 200 may comprise guide rail 206 and a fastener, such as standard or unidirectional wedgelock 210 is used. In this configuration, the application of force by wedgelock 210 is unidirectional, e.g. standard fastener or wedgelock 210 forces at least one guide rail 206 against at least one of internal walls 106 of chassis mounting slot 104.

Electronic components, such as at least one circuit card module 212, may be mounted to one or more primary heat frame(s) 202 and secondary heat frame(s) 204. In an exemplary embodiment, multi-slot card assembly 200 comprises two or more circuit modules 212, each having an exemplary FPGA chipset 222, which need to communicate quickly with each other. At least one circuit card module 212 and other electronic components may generate heat or otherwise require heat dissipation or cooling. In particular, more than one electronic component, e.g. two or more circuit card modules 212, can generate sufficient heat within an electronics assembly or system, thereby including heat dissipation capabilities tied to or involving chassis 102. Accordingly, at least one heat frame 202/204 may be constructed with any suitable materials or metals, including metals such as aluminum, adapted to provide or facilitate efficient heat transfer/dissipation.

Using separate heat frames, such as primary heat frame 202 and secondary heat frame 204, with a rigid header 220 therebetween, advantageously allows two circuit card modules 212 to maintain signal integrity, i.e. allows an FPGA chipset 222 of an exemplary circuit card module 212 (as shown in in FIG. 7) to communicate quickly with another FPGA chipset 222 of another circuit card module 212. However, some amount of misalignment between at least one heat frames 202/204 and respective chassis mounting slots 104, may result due to manufacturing tolerances, such as machining tolerances on at least one heat frames 202/204 as well as thickness tolerances of circuit card modules 212. Such misalignment can be detrimental (e.g. including stress and/or insufficient heat dissipation/conduction cooling) for circuit card modules 212 that rely on sufficient intimate contact between at least one heat frame 202/204 and chassis 102.

Thus, mitigating or eliminating this misalignment and its resulting effects requires maintaining sufficient intimate contact between at least one heat frame 202/204 and chassis 102, without inducing stresses in or less efficient (or insufficient) heat transfer through circuit card modules 212 and at least one heat frame 202/204.

Further, only using multiple sets of conventional or standard fasteners, such as wedgelocks or uni-directional wedgelocks, on each of at least one heat frame 202/204 risks less than optimal results with respect to (i) maintaining proper alignment and mechanical retention of at least one heat frame 202/204 relative to slots 104 of chassis 102 and (ii) thermal performance. If a first set of standard fasteners is engaged to seat secondary heat frame 204 against respective slot 104 of chassis 102, and if a second set of standard fasteners is engaged to seat primary heat frame 202 against respective slot 104 of chassis 102, merely using multiple sets of conventional fasteners in this way does not reliably close a gap formed between secondary heat frame 204 and chassis 102. This would lead to higher thermal resistance and lesser thermal performance, as well as misalignment issues. Thus, the use of conventional fasteners alone, results in at least one heat frame 202/204 and chassis 102 not being able to maintain sufficient intimate contact for proper alignment or mechanical retention and thermal management purposes.

To mitigate these misalignment and thermal management concerns between at least one heat frame 202/204 and chassis 102, multi-slot card assembly 200 of the present invention comprises both a moveable guide rail 206 and a fastener, such as a bi-directional or diagonal wedgelock 208, both of which are discussed further below.

Figure 3:
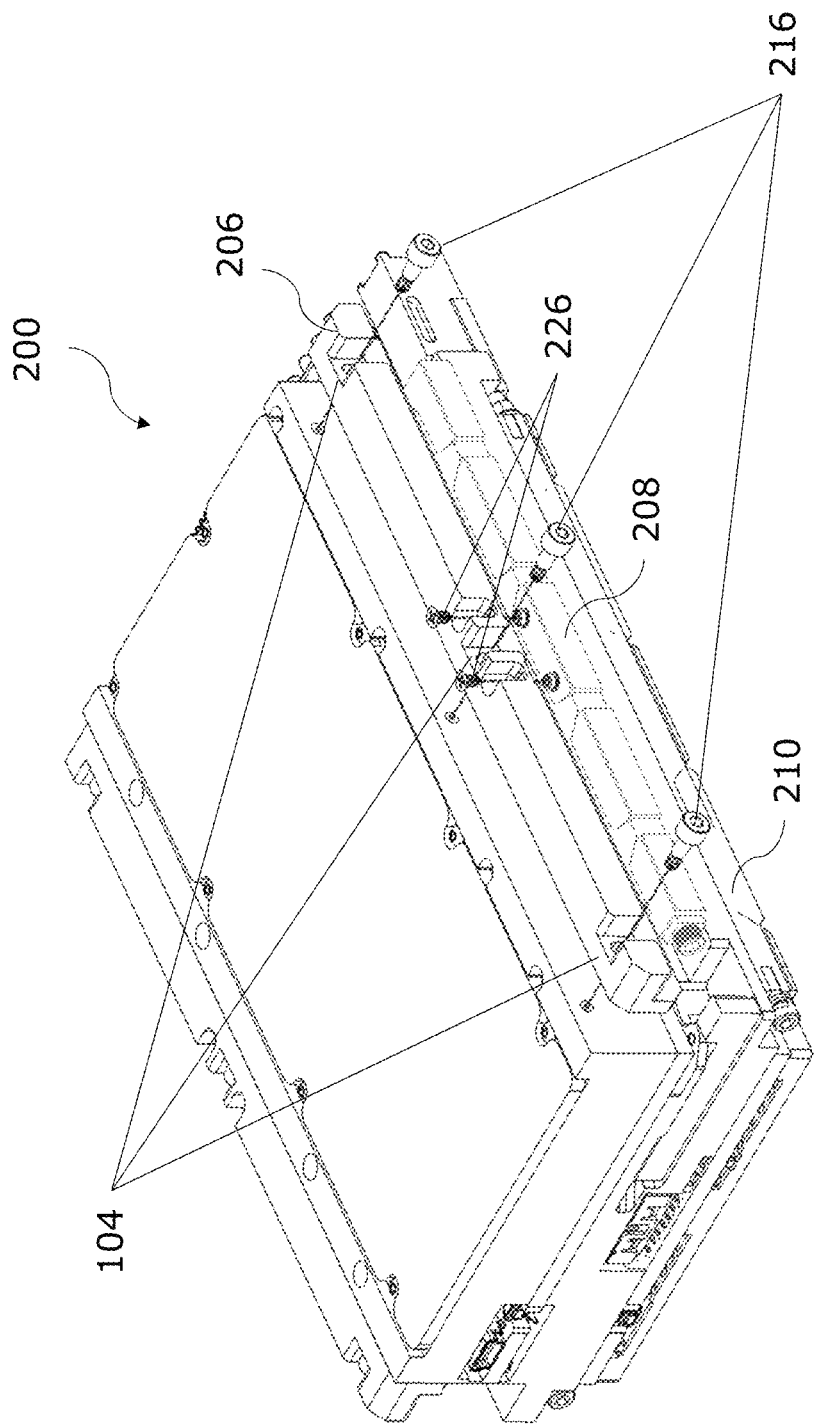
FIG. 3 is an isometric view of the multi-slot card assembly, showing an exemplary guide rail.

Turning now to FIG. 3, multi-slot card assembly 200 may comprise at least one guide rail 206, such as a floating rail, that is loosely attached, meaning that at least one guide rail 206 is moveable relative to at least one heat frame 202/204. As an exemplary embodiment, at least one guide rail 206 is loosely attached and movable relative to secondary heat frame 204. To facilitate this loose attachment between at least one guide rail 206 and at least one heat frame 202/204, at least one guide rail 206 defines a plurality of openings, such as mounting holes 214 (FIG. 4), and any suitable fasteners or combinations of fastening means, such as screws, nuts and bolts, rivets, spacers, washers, and so on may be used. In an exemplary embodiment, one or more fastening means, such as shoulder screws 216, are configured to extend through mounting holes 214, such that at least one guide rail 206 is sufficiently retained by at least one heat frame 202/204 and is also movable relative to at least one heat frame 202/204. In an exemplary embodiment, shoulder screws 216 extending through mounting holes 214 facilitates both the retention of at least one guide rail 206 to secondary heat frame 204 and movement of at least one guide rail 206 relative to secondary heat frame 204. The translational or rotational movement of shoulder screws 216 within a space defined by mounting holes 214 facilitates the movement of at least one guide rail 206 relative to secondary heat frame 204.

Figure 4:
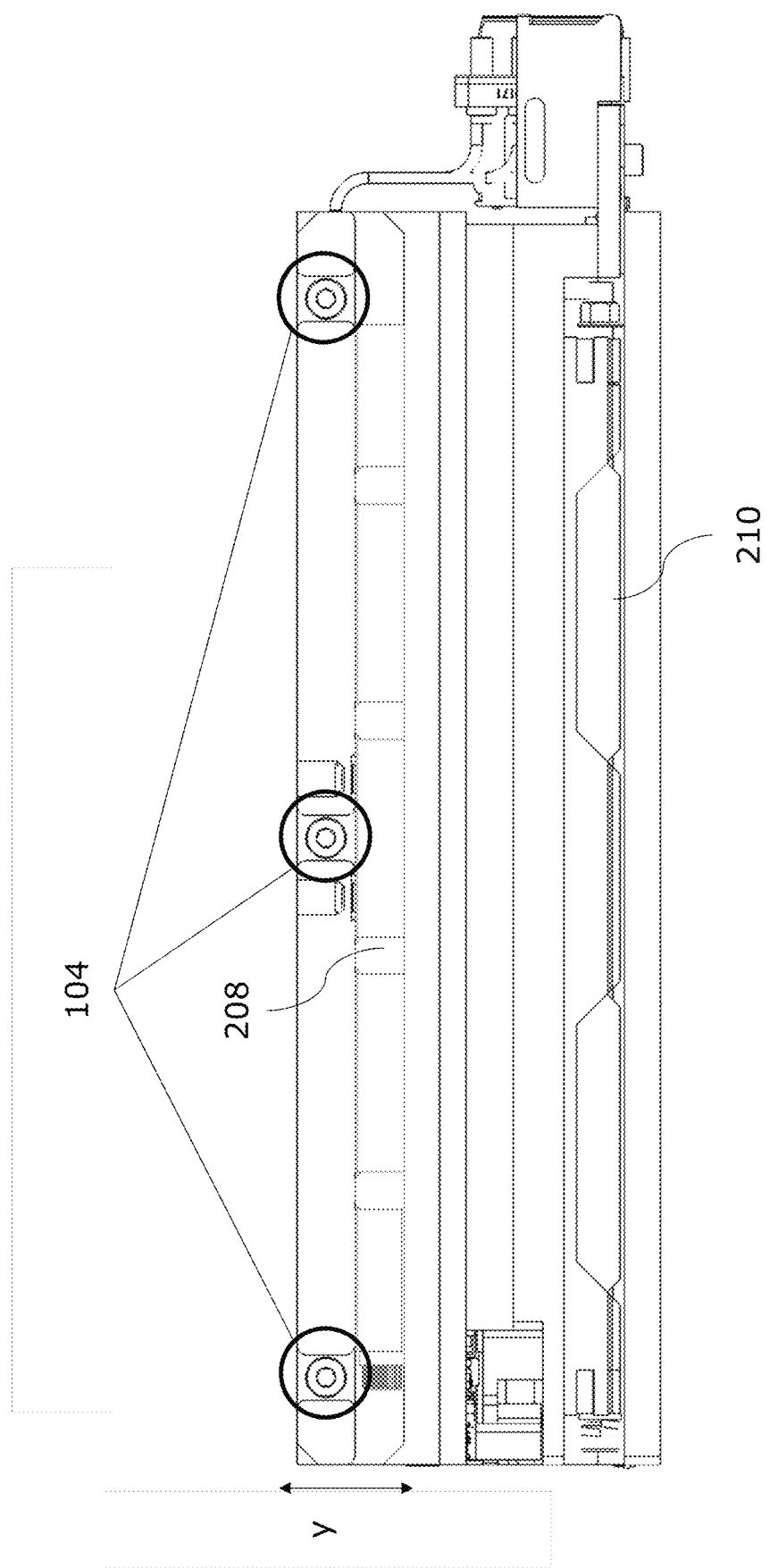
FIG. 4 is a side view of the multi-slot card assembly, showing movement of the guide rail.
Figure 5:
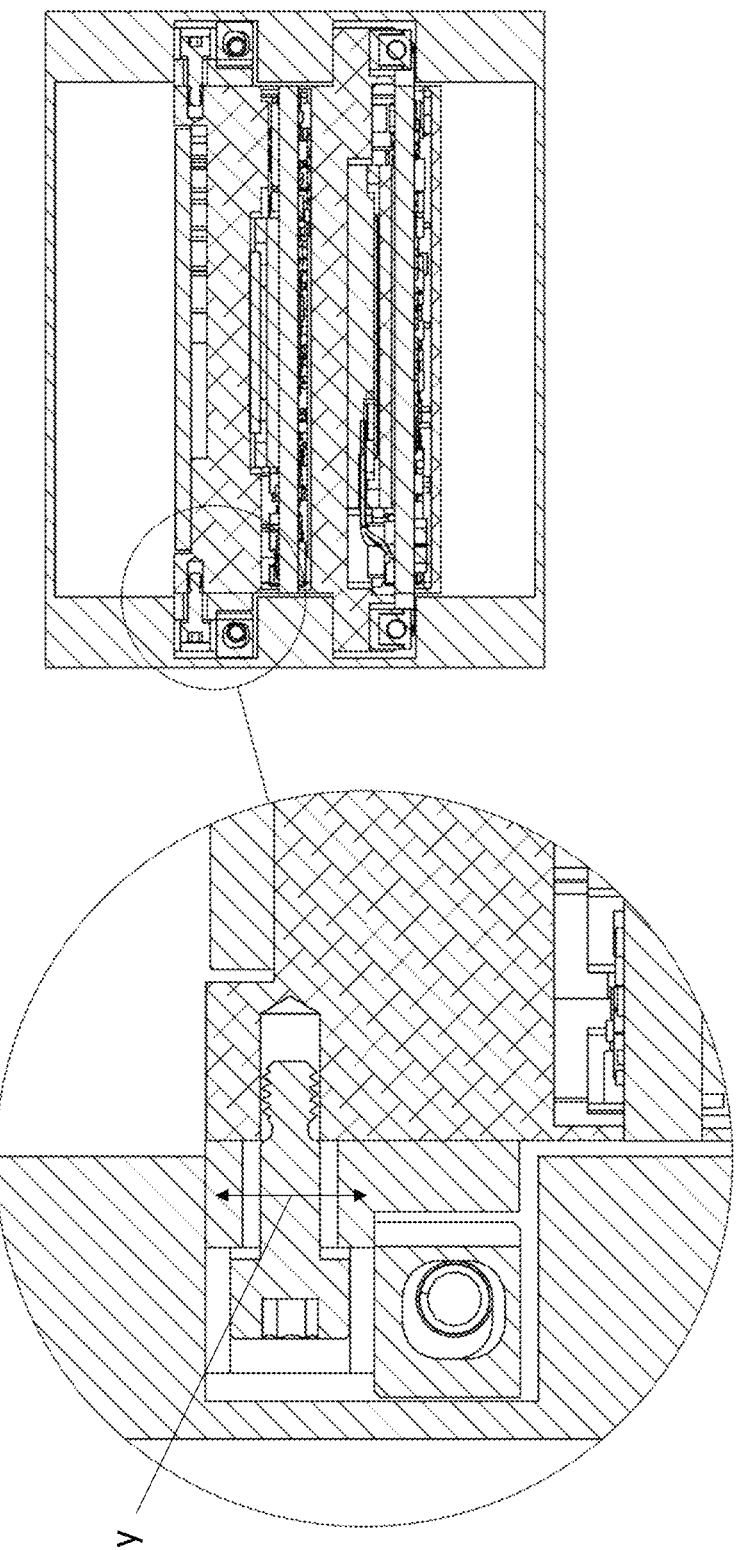
FIG. 5 is a cross-section view of a portion of the electronic assembly.

As an exemplary embodiment and as illustrated in FIGS. 4-5, at least one guide rail 206 may be displaced along a direction, y, in a generally longitudinal or vertical (up and down) direction. Particularly, at least one guide rail 206 may be displaced along a generally orthogonal direction, y, relative to one of internal walls 106 of slot 104. Displacement along direction, y, accounts for tolerance stackup due to manufacturing tolerances of chassis 102 and heat frame 202/204. In yet another exemplary embodiment, at least one guide rail 206 may also be displaced along a direction, x, in a generally lateral or horizontal (left to right, or right to left) direction. Still further, at least one guide rail 206 may also be displaced along a combination of a direction, y, and a direction, x.

Figure 6B:
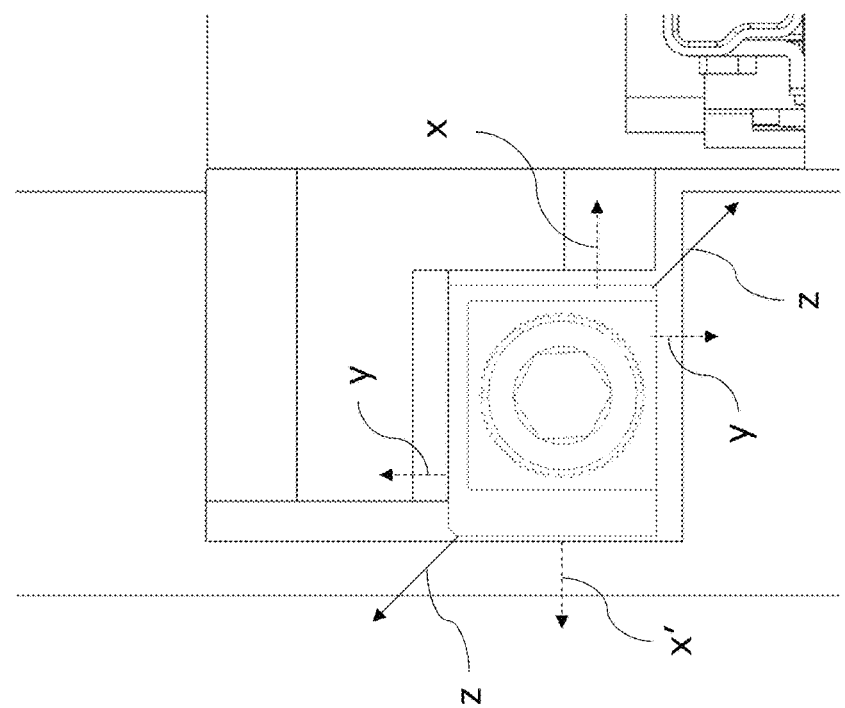
FIG. 6A-6B shows detailed views of a portion of the electronic assembly, showing an exemplary fastener.
Figure 6A:
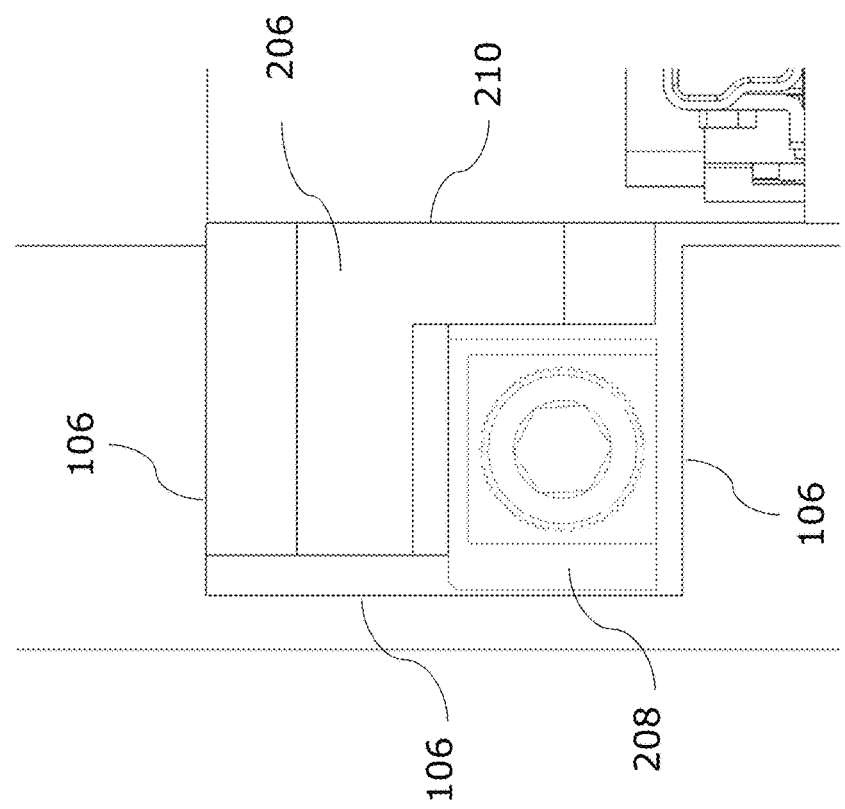

Referring now to FIGS. 6A-6B, multi-slot card assembly 200 comprises at least one fastener, such as a bi-directional or diagonal wedgelock 208. At least one fastener 208 is coupled to at least one guide rail 206, such that at least one guide rail 206 is moveable relative to at least one heat frame 202/204. In an exemplary embodiment, at least one fastener 208 may be attached to at least one guide rail 206 with attachment means, such as flathead screws 226 (FIG. 3), so that that at least one fastener 208 is loosely attached to at least one guide rail 206. In other words, at least one fastener 208 and at least one guide rail 206 are loosely attached, such that they are moveable relative to one another, but at least one fastener 208 and at least guide rail 206 are not disconnected upon engagement of one or more components of electronic assembly 100. A person of ordinary skill in the art would understand from the description herein that at least one fastener 208 may be attached to at least one guide rail 206 based on known attachment means, such that they are loosely attached to each other. Additionally or optionally, at least one fastener may include a conventional wedgelock 210. At least one fastener 208 may have a size and shape that corresponds to the size and shape of respective slot 104 of chassis 102 so that a respective protrusion or floating rail assembly 228 of multi-slot card assembly 200 may be inserted into a respective slot 104. When multi-slot card assembly 200 is mounted into chassis 102, at least one fastener 208 provides a robust mechanical joint that properly aligns and secures multi-slot card assembly 200 within chassis 102. In this way, at least one fastener 208 allows for chassis 102 to hold or retain multi-slot card assembly 200 during normal operation and movement, if any, of electronic assembly 100.

At least one fastener 208 is moveable or expandable to apply force to at least one guide rail 206 and respective chassis mounting slot 104 when multi-slot card assembly 200 is mounted into chassis 102. In an exemplary embodiment, when at least one fastener 208 is moved or expanded, at least one fastener 208 forces at least one guide rail 206 against both side wall 230 of secondary heat frame 204 and one of internal walls 106 of chassis mounting slot 104. When standard fastener or wedgelock 210 is used, the application of force is unidirectional, e.g. standard fastener or wedgelock 210 forces at least one guide rail 206 against one of internal walls 106 of chassis mounting slot 104.

In operation, as shown in FIG. 6B, at least one fastener 208 is engaged to move or expand along an oblique displacement direction, z, relative to one of internal walls 106 of chassis mounting slot 104. Specifically, the diagonal expansion of at least one fastener 208, creates orthogonal reaction loads between at least one guide rail 206, chassis 102, and secondary heat frame 204. As at least one fastener 208 moves or expands, it applies force in a lateral or horizontal direction relative to one of internal walls 106 of chassis mounting slot 104. In an exemplary embodiment, the application of force in a lateral direction, x, causes at least one guide rail 206 to make contact with side wall 230 of secondary heat frame 204. Additionally, the application of force in a lateral direction, x', causes at least one guide rail 206 to make contact with one of internal walls 106 of chassis mounting slot 104. Further, as at least one fastener 208 moves or expands, it applies force in an orthogonal direction relative to one of internal walls 106 of chassis mounting slot 104. In an exemplary embodiment, the application of force in an orthogonal direction, y, causes at least one guide rail 206 to make contact with two or more of internal walls 106 of chassis mounting slot 104. In effect, when multi-slot card assembly 200 is mounted within chassis 102 and at least one fastener 208 is moved or expanded, at least one fastener 208 forces at least one guide rail 206 against both side wall 230 of secondary heat frame 204 and one of internal walls 106 of chassis mounting slot 104. Although FIGS. 6A-6B depict the operation or expansion of at least one fastener 208, it should be understood from the description herein that the same operation or expansion may be applied to any other fastener 208 of multi-slot card assembly 200. Thus, fastener 208 coupled to a side of at least one heat frame 202/204 and another fastener 208 coupled to an opposite side of at least one heat frame 202/204, as depicted in FIG. 1B, may have a similar operation or expansion as described in FIGS. 6A-6B.

Therefore, at least one fastener 208 and least one guide rail 206 together provide robust mechanical retention of multi-slot card assembly 200 into chassis 102. Specifically, at least one fastener 208 creates orthogonal forces which securely fix (i) at least one guide rail 206 to at least one heat frame 202/204 and (ii) at least one guide rail 206 to chassis 102 simultaneously. This configuration advantageously does not rely on deformation of secondary heat frame 204 to conform to chassis slot 104, which may be less mechanically reliable.

Additionally or optionally, at least one fastener 208 and at least one guide rail 206 together provide an efficient heat transfer path for heat dissipation or cooling from at least one circuit card module 212. The efficient heat transfer path is achieved by maintaining sufficient intimate contact between multi-slot card assembly 200 and chassis 102 based on the expansion and diagonal displacement of at least one fastener 208 that causes at least one guide rail 206 to be sufficiently intimately connected with both side wall 230 of at least one heat frame 202/204 and at least one of internal walls 106 of slot 104. This increases the surface area available to dissipate or transfer the heat generated by the electronic components, such as at least one circuit card module 212 having an exemplary FPGA chipset 222. In particular, when multi-slot card assembly 200 contains multiple circuit card modules 212 that together generate heat, it is beneficial to provide for a greater surface area through which heat may be dissipated.

Figure 7:
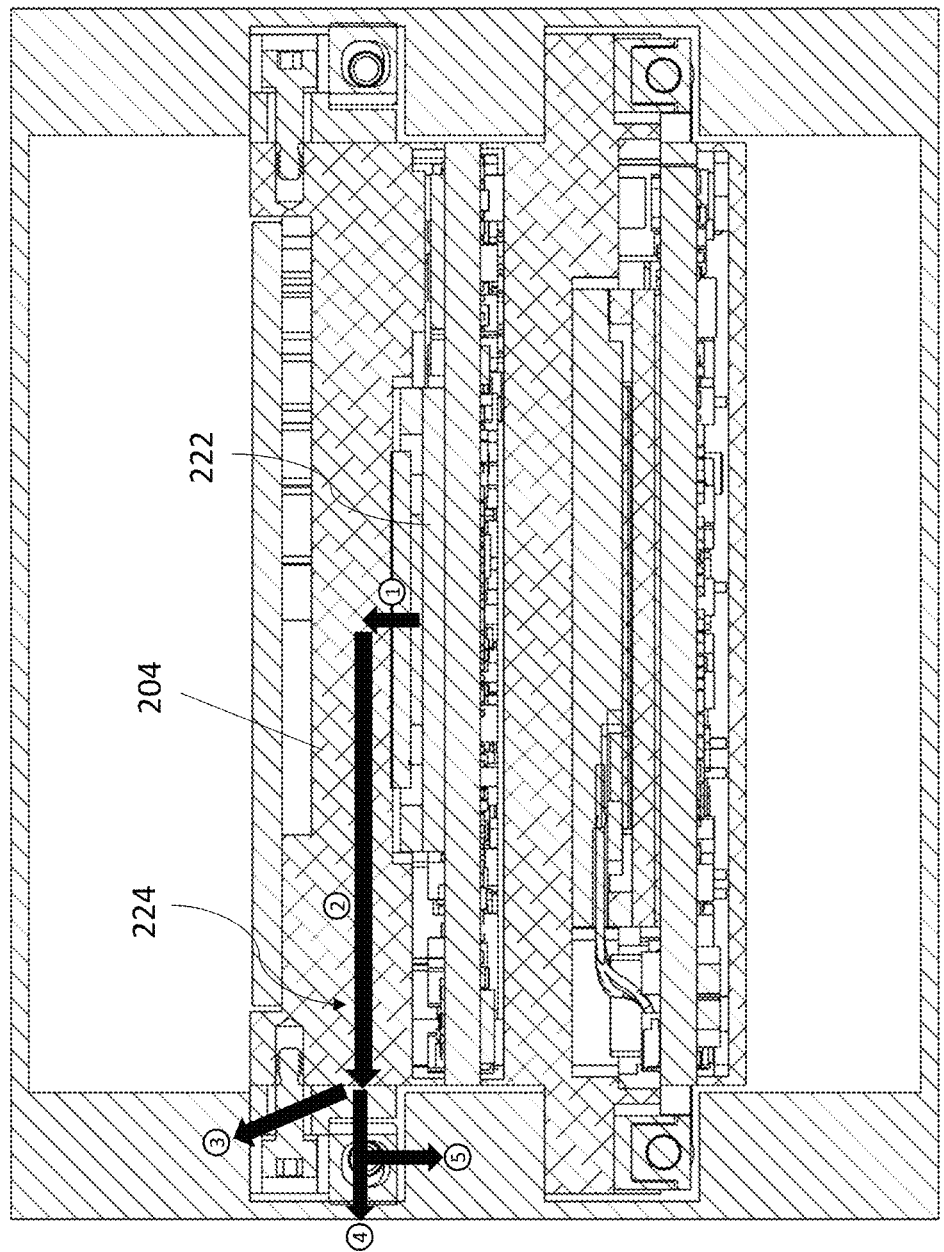
FIG. 7 is a cross-section view of a portion of the electronic assembly.

In an exemplary embodiment, a heatflow path or heat transfer path 224 through least one guide rail 206 and at least one fastener 208 is illustrated in FIG. 7. Heat is generated by an exemplary FPGA chipset 222 and heat flows out, as indicated by arrow (1) in FIG. 7. Heat flows or dissipates through secondary heat frame 204 from FPGA chipset 222, as indicated by arrow (2) in FIG. 7. Further, heat passes through at least one guide rail 206 and one of internal walls 106, as indicated by arrow (3) in FIG. 7. Heat also flows through at least one fastener 208 and into another of internal walls 106, as indicated by arrow (4) in FIG. 7. Heat further flows through at least one fastener 208 and into another of internal walls 106, as indicated by arrow (5) in FIG. 7. Although FIG. 7 shows an exemplary heat flow path or heat transfer path 224 through at least one guide rail 206 and at least one fastener 208, it should be understood from the description herein that a similar heat flow path or heat transfer path may be applied throughout similar components of multi-slot card assembly 200. Thus, guide rail 206 and fastener 208 coupled to a side wall 230 of at least one heat frame 202/204 and another guide rail 206 and fastener 208 coupled to an opposite side wall 230 of at least one heat frame 202/204, as depicted in FIG. 1B, may have similar heat flow path or heat transfer path 224 as described in FIG. 7. Still further, it should be understood that although FIG. 7 shows am FPGA chipset 222 as a heat-generating component, the circuit card module 212 may include one or more other heat-generating components.

Still further, multi-slot card assembly 200 can be advantageously mounted within a standard conduction cooled chassis, without additional components or special tools for in-field maintenance of module replacement.

Moreover, the use of a pair of at least one moveable guide rail 206 and a corresponding pair of at least one diagonal fastener 208, at least one standard or unidirectional wedgelock 210), or a combination thereof, for each circuit card module 212 of multi-slot card assembly 200 is preferable over an alternative design of separating circuit card modules 212 into distinct and separate card assemblies with a cable therebetween because routing a large amount of cables between two or more circuit modules 212 would be logistically impractical. Additionally, the use of a pair of at least one moveable guide rail 206 and a corresponding pair of at least one diagonal fastener 208, at least one standard or unidirectional wedgelock 210), or a combination thereof, is preferable over an alternative design of connecting the two circuit modules 212 through the backplane because this would be electrically undesirable based on the necessity of highly dense, complex routing and additional length in the signal path. Still further, the use of a pair of at least one moveable guide rail 206 and a corresponding pair of at least one diagonal fastener 208, at least one standard or unidirectional wedgelock 210), or a combination thereof, is preferable over an alternative design of mounting the circuit card modules 212 such that the high power dissipating components, or heat-generating components, face inwards toward each other and using one intermediary heat frame 202/204 for heat sinking because two circuit card modules 212 would generate too much power to be effectively cooled by single heat frame 202/204, such that additional thermal management components (i.e. heat pipes, vapor chambers, etc.) would be required, thereby adding undesired complexity, weight, and cost.

Figure 8:
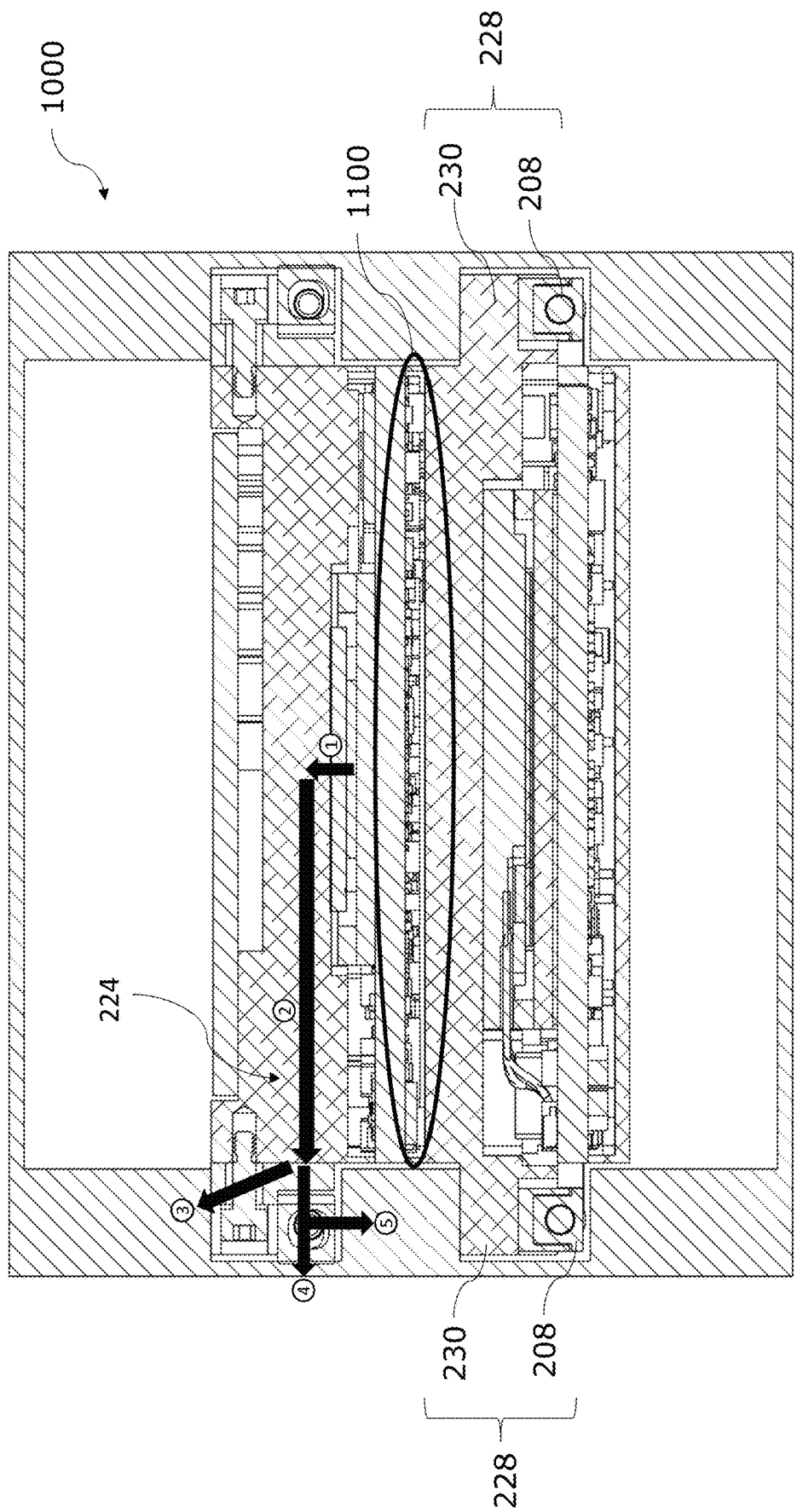
FIG. 8 is a cross-section view of a portion of another electronic assembly.
Figure 9:
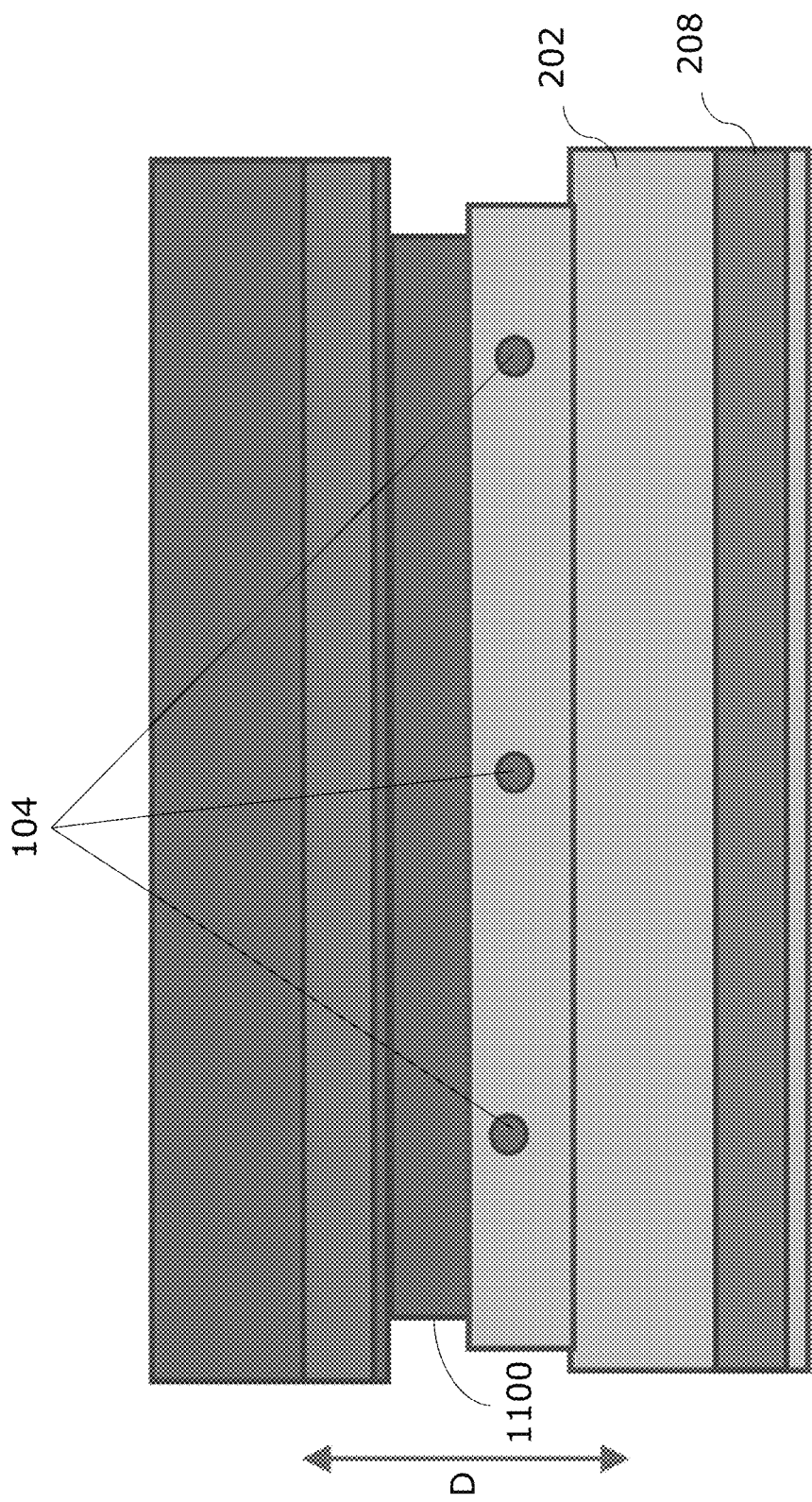
FIG. 9 is a side view of a portion of the electronic assembly of FIG. 8.

A second embodiment of electronic assembly 100 including mufti-slot card assembly 200 mounted into chassis 102, such as electronic assembly 1000, is illustrated in FIGS. 8-9. Electronic assembly 1000 corresponds or is similar to the exemplary embodiment discussed above, except that plurality of slots 104 of chassis 102 is configured to receive a portion of at least one heat frame 202/204. For example, at least one side wall 230 of at least one heat frame 202/204 at least partially extends within respective slot 104 of chassis 102, such that a portion of at least one heat frame 202/204 extends above diagonal fastener 208 (FIG. 8). Thus, adjacent to each internal wall or surface 106 of respective slot 104 of chassis 102 is at least corresponding protrusion 228 (FIG. 2) of multi-slot card assembly 200 comprising side wall 230 of at least one heat frame 202/204 and diagonal fastener 208. As shown in FIG. 8, protrusion 228 is configured to be received by one or more slots 104 of chassis 102. Further, it should be understood that although FIG. 8 references one protrusion 228 of multi-slot card assembly 200, protrusion 228 may be similarly present and adjacent to each internal wall or surface 106 of respective slot 104 of chassis 102.

Additionally or optionally, electronic assembly 1000 may include a thermal pad, such as thermal pad 1100 having an equilibrium height and positionable between at least two circuit modules 212. Thermal pad 1100 may be configured to provide a thermal interface between primary heat frame 202 and secondary heat frame 204 and/or between two or more circuit modules 212, each having an exemplary FPGA chipset 222. Additionally or optionally, thermal pad 1100 may be adapted to accommodate misalignment or slip, such as a misalignment or slip that may occur when multi-slot card assembly 200 is mounted into chassis 102, To achieve this, thermal pad 1100 may comprise conformable or less rigid material (relative to chassis 102 or heat frame 202/204, for example). In a non-limiting example, thermal pad 1100 may comprise material, such as the T-FLEX™ 700, a ceramic filled silicon sheet, as described and designed by Laird Technologies, Inc. of Chesterfield, Missouri, and/or the silicone-based thermal interface materials (TIM) as described and designed by Shin-Etsu Chemical Co., Ltd, of Tokyo, Japan. In this way, thermal pad 1100 may be sufficiently conformable or adjustable during mounting of multi-slot card assembly 200 into chassis 102, such that thermal pad 1100 is able to move between a more compressed state and a more relaxed state. This movement may be along the vertical direction (as indicated by arrow D in FIG. 9). Displacement along this direction, D, accounts for tolerance stackup due to manufacturing tolerances of chassis 102 and heat frame 202/204. Still further, at least a portion of the thermal pad decreases in height relative to the equilibrium height when the thermal pad is in the more compressed state, and at least another portion of the thermal pad increases in height to return to the equilibrium height when the thermal pad is in the more relaxed state.

Finally, as with electronic assembly 100 and components thereof discussed above, components of electronic assembly 1000 may be secured to at least one other component of electronic assembly 1000 (e.g. heat frame 202/204 and diagonal fastener 208) using any suitable fasteners or combinations of fastening means, such as screws, nuts and bolts, rivets, spacers, washers, and so on.

Figure 10:
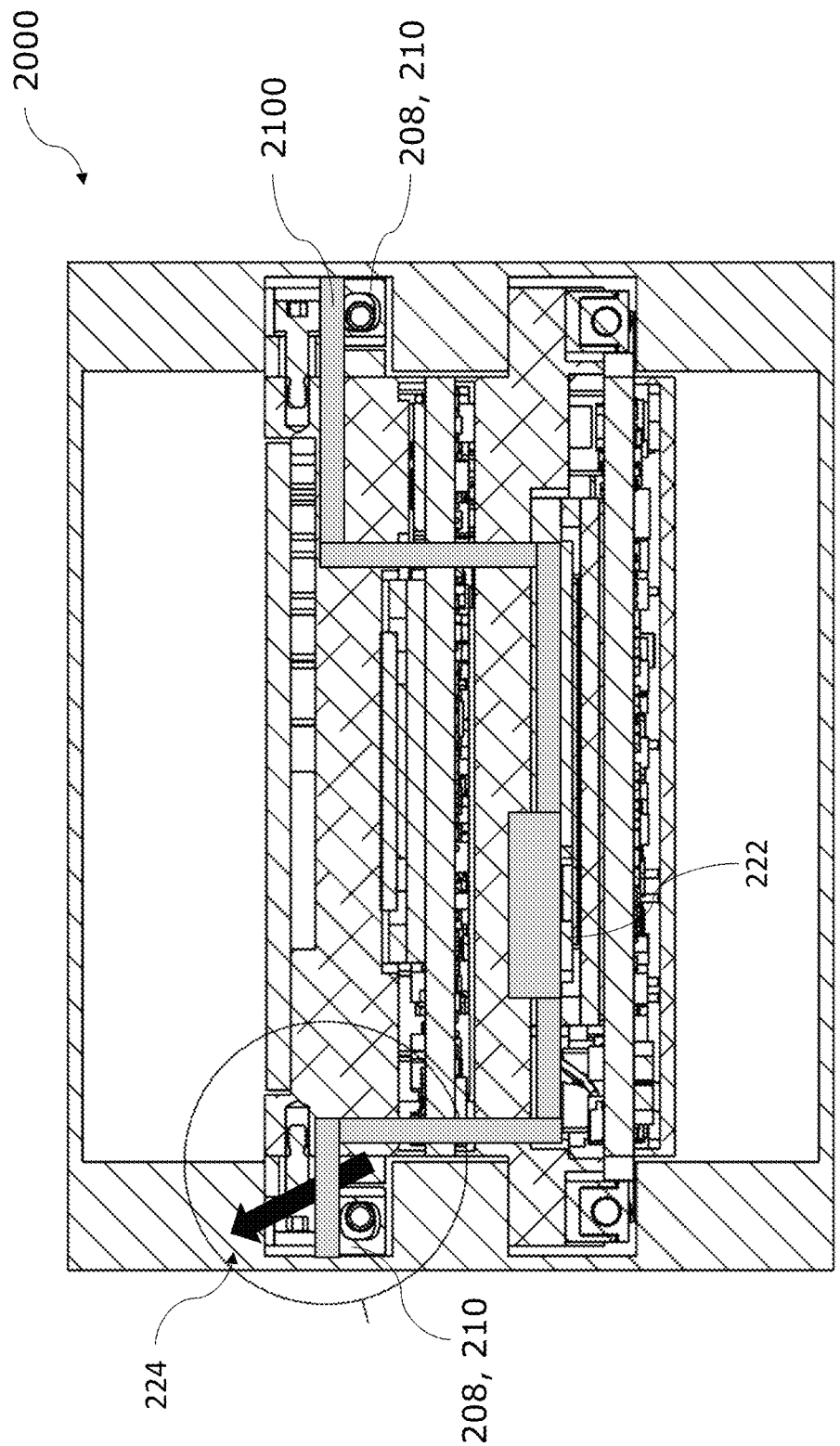
FIG. 10 is a cross-section view of a portion of another electronic assembly.
Figure 11:
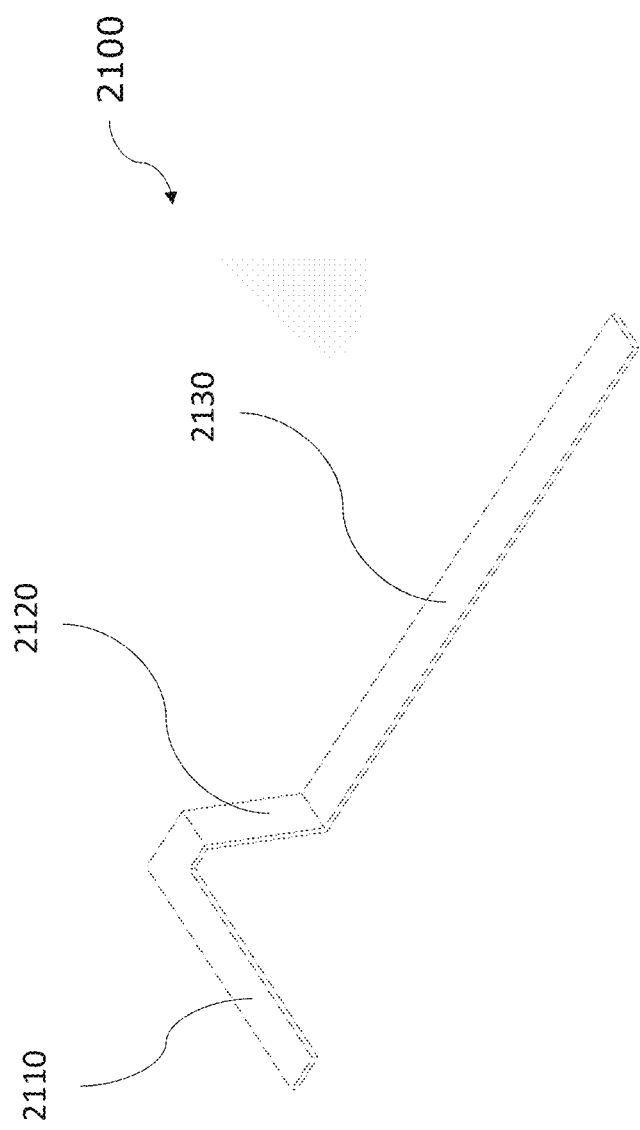
FIG. 11 is a diagram depicting an exemplary flexible heat pipe.

A third embodiment of electronic assembly 100 including multi-slot card assembly 200 mounted into chassis 102, such as electronic assembly 2000, is illustrated in FIG. 10. Electronic assembly 2000 corresponds or is similar to the exemplary embodiments discussed above, such electronic assemblies 100, 1000, except that there is no additional heat frame aside from primary heat frame 202 and it includes a heat transfer apparatus comprising at least one heat pipe 2100. Heat pipe 2100 is positioned relative to circuit module 212 having FPGA chipset 222 and primary heat frame 202, such that heat pipe 2100 is in thermal contact with one or more of chipset 222 and primary heat frame 202. Still further, heat pipe 2100 may be positioned relative to the two or more mounting slots 104 of the chassis 102, such that a first end of heat pipe 2100 is adjacent or in thermal contact with a fastener, such as diagonal fastener 208 or standard fastener 210, and a second end of heat pipe 2100 opposite the first end is adjacent or in thermal contact with another fastener, such as diagonal fastener 208 or standard fastener 210. In this configuration, heat pipe 2100 provides a heat transfer path 224 for the heat generated by FPGA chipset 222. Heat transfer from FPGA chipset 222 of another circuit card module 212 (i.e. above primary heat frame 202) may be dissipated via heat transfer path 224 provided by heat pipe 2100. In a non-limiting example, a channel formed between FPGA chipset 222 of another circuit card module 212 and heat pipe 2100 may be used to achieve heat dissipation. Additionally or optionally, heat pipe 2100 may comprise flexible or conformable material and because they undergo a sintering process during manufacture, tolerance stackup issues may be mitigated or prevented. In an exemplary embodiment, as shown in FIG. 11, heat pipe 2100 comprises at least one first section 2110 extending along a plane substantially parallel to one of walls 106 of mounting slots 104 of chassis 102. Additionally or optionally, heat pipe 2100 comprises at least one second section 2120 extending along a plane angled relative to at least one first section 2110. In one non-limiting example, heat pipe 2100 comprises at least one second section 2120 extending along a plane angled at approximately 90°, such that at least one second section 2120 is substantially perpendicular to at least one first section 2110. Additionally or optionally, heat pipe 2100 comprises at least one third section 2130, which extends along a plane substantially parallel to at least one first section 2110 and/or angled relative to at least one second section 2120.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. A multi-slot card assembly having two or more protrusions and configured to mount into a chassis having two or more chassis mounting slots, the chassis mounting slots each having at least three walls, the multi-slot card assembly comprising:
   at least two heat frames comprising a primary heat frame and a secondary heat frame;
   at least two circuit card modules comprising a primary circuit card module mounted adjacent the primary heat frame and a secondary circuit card module mounted adjacent the secondary heat frame, wherein the primary circuit card module and the secondary circuit card module are in electrical communication with each other;
   at least one fastener configured to be expandable to apply force to one or more of the at least one heat frame and the respective chassis mounting slot, when the multi-slot card assembly is mounted into the chassis; and
   wherein the two or more protrusions comprise at least one guide rail attached to the at least two heat frames and moveable relative to the at least two heat frames, and wherein the at least one fastener and the least one guide rail together provide mechanical retention of the multi-slot card assembly when mounted within the chassis.

2. The multi-slot card assembly of claim 1, wherein the two or more protrusions comprise a surface of the at least two heat frames and the at least one fastener.

3. The multi-slot card assembly of claim 2, wherein the surface of the at least two heat frames and the at least one fastener together provide mechanical retention of the multi-slot card assembly when mounted within the chassis.

4. The multi-slot card assembly of claim 3, wherein the surface of the at least two heat frames and the at least one fastener together provide a heat transfer path for heat dissipation from the at least two circuit card modules.

5. The multi-slot card assembly of claim 1, wherein the at least one fastener and the at least one guide rail together provide a heat transfer path for heat dissipation from the at least two circuit card modules.

6. The multi-slot card assembly of claim 1, wherein the at least one fastener is configured to expand along an oblique displacement direction relative to at least one of the walls of the chassis mounting slots.

7. The multi-slot card assembly of claim 1, wherein the at least one fastener is configured to apply the force in a lateral direction relative to at least one of the walls of the chassis mounting slots.

8. The multi-slot card assembly of claim 1, wherein the at least one fastener is configured to apply the force in an orthogonal direction relative to at least one of the walls of the chassis mounting slots.

9. The multi-slot card assembly of claim 1, wherein the at least one guide rail is movable along a further displacement direction that is orthogonal to the at least one fastener.

10. The multi-slot card assembly of claim 1, further comprising a heat transfer apparatus in thermal contact with one or more of the at least two circuit card modules and the at least two heat frames.

11. The multi-slot card assembly of claim 10, wherein the heat transfer apparatus comprises a heat pipe configured to provide a heat transfer path for heat dissipation from the at least two circuit card modules.

12. The multi-slot card assembly of claim 11, wherein the heat pipe is in thermal contact with the at least two heat frames.

13. The multi-slot card assembly of claim 12, wherein the heat pipe has a first end and a second end opposite the first end, the first end of the heat pipe being in thermal contact with the at least one fastener and the second end of the heat pipe being in thermal contact with another of the at least one fastener.

14. The multi-slot card assembly of claim 11, wherein the heat pipe comprises flexible material.

15. The multi-slot card assembly of claim 14, wherein the heat pipe comprises at least one first section extending along a plane substantially parallel to one of the chassis mounting slots.

16. The multi-slot card assembly of claim 15, wherein the heat pipe comprises at least one second section extending along a plane angled relative to the at least one first section.

17. The multi-slot card assembly of claim 1, further comprising a thermal pad positionable between the at least two circuit modules or between two of the at least two heat frames.

18. The multi-slot card assembly of claim 17, wherein the thermal pad is configured to accommodate a misalignment between the multi-slot card assembly and chassis, when the multi-slot card assembly is mounted into the chassis.

19. The multi-slot card assembly of claim 18, wherein the thermal pad is configured to move between a more compressed state and a more relaxed state when the multi-slot card assembly is mounted into the chassis, wherein in the more compressed state, at least a portion of the thermal pad decreases in height relative to when the thermal pad is in the more relaxed state and wherein in the more relaxed state, at least a portion of the thermal pad increases in height relative when the thermal pad is in the more relaxed state.

20. An electronic assembly comprising:
a chassis having two or more chassis mounting slots, the chassis mounting slots each having at least three walls;
a multi-slot card assembly having two or more protrusions and mountable into the chassis, the multi-slot card assembly comprising:
at least two heat frames comprising a primary heat frame and a secondary heat frame;
at least two circuit card modules comprising a primary circuit card module mounted adjacent the primary heat frame and a secondary circuit card module mounted adjacent the secondary heat frame, wherein the primary circuit card module and the secondary circuit card module are in electrical communication with each other;
at least one fastener configured to be expandable to apply force to one or more of the at least one heat frame and the respective chassis mounting slot, when the multi-slot card assembly is mounted into the chassis; and
wherein the two or more protrusions comprise at least one guide rail attached to the at least two heat frames and moveable relative to the at least two heat frames, and wherein the at least one fastener and the least one guide rail together provide mechanical retention of the multi-slot card assembly when mounted within the chassis.

21. A multi-slot card assembly having at least two protrusions and configured to mount into a chassis having two pairs of chassis mounting slots, the chassis mounting slots each having at least three walls, the multi-slot card assembly comprising:
a primary heat frame including a primary heat frame surface;
a secondary heat frame including a secondary heat frame side wall;
at least two circuit card modules mounted adjacent at least one of the primary heat frame and the secondary heat frame;
a pair of bi-directional fasteners expandable to apply force to at least one of the walls of the chassis mounting slots; and
wherein the two or more protrusions comprise at least one guide rail attached to the at least two heat frames and moveable relative to the at least two heat frames, and wherein the at least one fastener and the least one guide rail together provide mechanical retention of the multi-slot card assembly when mounted within the chassis.

22. The multi-slot card assembly of claim 21, wherein the two or more protrusions comprise the pair of bi-directional fasteners and respective primary heat frame surface.

23. The multi-slot card assembly of claim 22, wherein when the multi-slot card assembly is mounted into the chassis and when the pair of bi-directional fasteners is expanded, each of the pair of bi-directional fasteners forces respective guide rails against both one of the walls of the chassis mounting slot and the primary heat frame surface.

24. The multi-slot card assembly of claim 23, wherein the pair of bi-directional fasteners and respective primary heat frame surface together provide mechanical retention of the multi-slot card assembly when mounted within the chassis.

25. The multi-slot card assembly of claim 24, wherein the pair of bi-directional fasteners and respective primary heat frame surface together provide a heat transfer path for heat dissipation from the at least two circuit card modules.

26. The multi-slot card assembly of claim 22, wherein the two or more protrusions comprise a pair of guide rails, each attached to the secondary heat frame side wall and an opposite secondary heat frame side wall, respectively, and both guide rails being moveable relative to the secondary heat frame.

27. The multi-slot card assembly of claim 26, wherein when the multi-slot card assembly is mounted into the chassis and when the pair of bi-directional fasteners is expanded, each of the pair of bi-directional fasteners forces respective guide rails against both one of the walls of the chassis mounting slot and the secondary heat frame side walls.

28. The multi-slot card assembly of claim 26, wherein the pair of bi-directional fasteners and the pair of guide rails together are configured to provide mechanical retention of the multi-slot card assembly when mounted within the chassis.

29. The multi-slot card assembly of claim 27, wherein the pair of bi-directional fasteners and the pair of guide rails together are configured to provide a heat transfer path for heat dissipation from the at least two circuit card module when mounted within the chassis.

30. The multi-slot card assembly of claim 26, further comprising a pair of uni-directional fasteners, each attached to a primary heat frame surface and an opposite primary heat frame surface, respectively.

31. An electronic assembly comprising:
a chassis having at least two chassis mounting slots, the chassis mounting slots each having at least three walls; and
a multi-slot card assembly of claim 21.

* * * * *